(12) United States Patent
Park et al.

(10) Patent No.: US 12,148,895 B2
(45) Date of Patent: Nov. 19, 2024

(54) EXTERNAL DIAGNOSTICS AND MODULE STATUS CHANGE DEVICES FOR BATTERY MODULES

(71) Applicant: LG Chem, Ltd., Seoul (KR)

(72) Inventors: Jong Doo Park, Daejeon (KR); Duk Su Kim, Sejong-Si (KR); Jong Kook Lee, Daejeon (KR); Ho Soo Kim, Daejeon (KR); Sung Hyun Cho, Daejeon (KR); Geun Wook Lim, Daejeon (KR); Jin Seok Heo, Daejeon (KR)

(73) Assignee: LG Chem, Ltd., Seoul (KR)

( * ) Notice: Subject to any disclaimer, the term of this patent is extended or adjusted under 35 U.S.C. 154(b) by 1039 days.

(21) Appl. No.: 15/873,431

(22) Filed: Jan. 17, 2018

(65) Prior Publication Data

US 2018/0217208 A1 Aug. 2, 2018

(30) Foreign Application Priority Data

Jan. 17, 2017 (KR) ........................ 10-2017-0008243

(51) Int. Cl.
*H01M 10/42* (2006.01)
*G01R 31/36* (2020.01)
*G01R 31/392* (2019.01)
*G01R 31/396* (2019.01)
*H01M 10/48* (2006.01)
(Continued)

(52) U.S. Cl.
CPC .... *H01M 10/4257* (2013.01); *G01R 31/3648* (2013.01); *G01R 31/392* (2019.01); *G01R 31/396* (2019.01); *H01M 10/48* (2013.01); *H01M 10/486* (2013.01); *H02J 7/0029* (2013.01); *H02J 7/0048* (2020.01); *H02J 7/005* (2020.01); *H02J 7/34* (2013.01); *H02J 7/35* (2013.01); *H02J 9/06* (2013.01); *H01M 2010/4271* (2013.01); *H01M 2010/4278* (2013.01); *H02J 7/00302* (2020.01); *H02J 7/00304* (2020.01); *H02J 7/00306* (2020.01); *H02J 2300/28* (2020.01); *Y02B 10/70* (2013.01); *Y02E 10/76* (2013.01)

(58) Field of Classification Search
CPC .............. G01R 31/3648; G01R 31/396; G01R 31/392; H02J 7/0047; H02J 7/0021; H02J 7/34; H01M 10/486; H01M 10/48; H01M 10/4257
See application file for complete search history.

(56) References Cited

U.S. PATENT DOCUMENTS 9,227,581 B1 * 1/2016 Gauthier .............. G07C 5/0808
10,794,957 B2 * 10/2020 Yoon ................... H01M 10/425
(Continued)

FOREIGN PATENT DOCUMENTS

| KR | 20030067862 A | 8/2003 |
| KR | 101468314 B1 | 12/2014 |
| KR | 20160046547 A | 4/2016 |

*Primary Examiner* — Paul D Lee
(74) *Attorney, Agent, or Firm* — Lerner David LLP

(57) ABSTRACT

Provided is an apparatus for battery diagnosis and module state change device capable of receiving power from a battery module through a connector connection with a battery module and operating, changing a diagnosis reference value for diagnosing, by a battery management system (BMS), a battery, and changing a setting value of the BMS to change a use of the battery module.

10 Claims, 3 Drawing Sheets

(51) Int. Cl.
　　　*H02J 7/00*　　　(2006.01)
　　　*H02J 7/34*　　　(2006.01)
　　　*H02J 7/35*　　　(2006.01)
　　　*H02J 9/06*　　　(2006.01)

(56) References Cited

U.S. PATENT DOCUMENTS

| | | | |
|---|---|---|---|
| 2011/0015815 A1* | 1/2011 | Bertness | G01R 31/007 |
| | | | 701/22 |
| 2011/0156652 A1* | 6/2011 | Kishiyama | B60L 58/15 |
| | | | 320/132 |
| 2013/0086409 A1* | 4/2013 | Lu | H04L 12/66 |
| | | | 713/340 |
| 2013/0179012 A1* | 7/2013 | Hermann | B60L 58/26 |
| | | | 700/275 |
| 2014/0103934 A1* | 4/2014 | Matsui | B60L 58/18 |
| | | | 324/427 |
| 2014/0117939 A1* | 5/2014 | Lim | H01M 10/482 |
| | | | 320/134 |
| 2015/0081163 A1* | 3/2015 | Molenkamp | G07C 5/00 |
| | | | 701/33.2 |
| 2015/0234015 A1* | 8/2015 | Park | G01R 31/396 |
| | | | 702/63 |
| 2016/0261125 A1* | 9/2016 | Kang | H02J 7/0018 |
| 2017/0353045 A1* | 12/2017 | Ravid | H01M 10/44 |
| 2018/0358663 A1* | 12/2018 | Yonemoto | B60L 58/16 |

* cited by examiner

EXTERNAL DIAGNOSTICS AND MODULE STATUS CHANGE DEVICES FOR BATTERY MODULES

CROSS-REFERENCE TO RELATED APPLICATION

This application claims priority to Korean Patent Application No. 10-2017-0008243 filed on Jan. 17, 2017 and all the benefits accruing therefrom under 35 U.S.C. § 119, the contents of which are incorporated by reference in their entirety.

BACKGROUND

The present disclosure relates to an external diagnosis and module state change device for a battery module, and more particularly, to a device receiving power through a connector connection with a battery module and operating, and capable of diagnosing and use-changing a battery module.

An energy storage system (ESS) is a system for enhancing a power use efficiency by storing a produced electricity in a storage device such as a battery and supplying the electricity if necessary, and includes the battery for storing the electricity and components for efficiently managing and controlling the battery. Among the components, a battery management system (BMS) monitors a voltage, a current, or a temperature, etc., of the battery and calculates data about a dangerous problem such as overcharge or over-discharge that may occur at the time of charging/discharging the battery, controls the temperature, current, or voltage according to a state of the battery to manage the battery so that the battery may be maintained in a stable state. To diagnose and check the battery state through the BMS is an important technology for the battery to be stably maintained.

In addition, a battery module of the ESS is formed in various usages for such as an uninterruptible power system (UPS), or a grid power generation system such as solar power, wind power, or hydroelectric power generation, and the use of the battery module may be changed if necessary.

To diagnose and check the battery state is typically performed in a way that a user directly checks battery data through data communication with the battery management system (BMS).

However, such a typical manner requires separate communication equipment for data communication between a battery module and a computer, and in order to check a physical defect in the battery module, it is necessary to test the battery module line by line using external devices, which is not efficient in cost and time. In addition, since it is necessary to individually provide a power supply device/cables for supplying driving power to the external devices, portability is lowered.

Furthermore, in order to change a use of a battery module, it is usual to provide a program suitable for each use and through this, the use of the battery module is changed. However, such a manner is costly, time-consuming and inconvenient, since it is necessary to provide a program for each use of the battery module, and install and manage the program.

SUMMARY

The present disclosure provides an external diagnosis and data change device for battery module.

In accordance with an exemplary embodiment, a battery diagnosis and data change device, including: a connection unit connected to a connector of a battery module; a communication unit connected to the connection unit and configured to transmit/receive data to/from a battery management system (BMS) configured to measure a temperature, a current, and a voltage of the battery module, and calculate data according to an operation state; a control unit configured to control data transmission/reception with the BMS; a diagnosis unit configured to diagnose a state of a battery to calculate a diagnosis result on a basis of data received from the BMS; a memory unit configured to store the calculated diagnosis result of the battery state; and a change data input unit configured to input data for changing data in the BMS.

The connection unit may receive power from the battery module upon being connected to the connector of the battery module.

The change data input unit may include: a determination data input unit configured to input data for changing a reference range in which the operation state of the battery module is determined; and a use change data input unit configured to change and input a setting value according to a use of the battery module set in the BMS so as to change the use of the battery module.

The determination data input to the determination data input unit may be in a control range of the temperature, current, and voltage set in the BMS so as to control the battery module in a stable state.

In accordance with another exemplary embodiment, a method for diagnosing a state of a battery module and changing data in a battery management module (BMS), includes: a connector connecting operation for connecting to a connector of the battery module; a battery data receiving operation for reading data of a battery from the BMS configured to measure a temperature, a current, and a voltage of the battery module, and to calculate data according to an operation state of the battery module; a diagnosis and result calculating operation for diagnosing a state of the battery module on a basis of battery data received from the BMS to calculate a diagnosis result; a diagnosis result storing operation for storing the calculated result; a change data inputting operation for inputting change data so as to change data in the BMS; and a change data transmitting operation for transmitting the input change data to the BMS.

In connector connecting operation, power may be received from the battery module through the connected connector.

The change data inputting operation may include: a determination data inputting operation for inputting determination data for changing a reference range in which an operation state of the battery module is determined in the BMS; and a use change data inputting operation for changing and inputting a setting value according to a use of the battery module set in the BMS so as to change the use of the battery module.

The determination data input in the determination data inputting operation may be in a control range of the temperature, current and voltage set in the BMS so as to control the battery module in a stable state.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
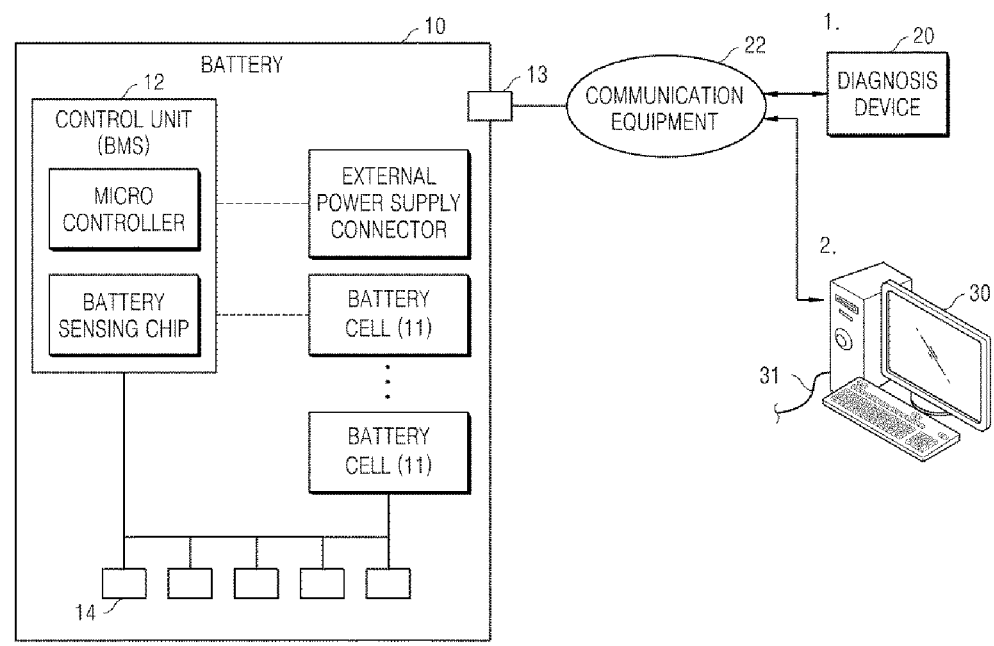
FIG. 1 schematically illustrates a configuration of a typical battery diagnosis and data change system.

Hereinafter, embodiments of the present disclosure will be described in detail with reference to the accompanying drawings so that the present disclosure can be easily realized by those skilled in the art. The present disclosure can be practiced in various ways and is not limited to the embodiments described herein. In the drawings, parts which are not related to the description are omitted to clearly set forth the present invention and similar elements are denoted by similar reference symbols throughout the specification.

It will be understood that, although the terms first, second, etc. may be used herein to describe various elements, these elements should not be limited by these terms. The terms are used only for the purpose of distinguishing one component from another component. For example, a first element could be termed a second element, and, similarly, a second element could be termed a first element, without departing from the scope of example embodiments. Terms used herein are provided for merely explaining specific embodiments of the present disclosure, not limiting the disclosure. The singular forms "a," "an" and "the" are intended to include the plural forms as well, unless the context clearly indicates otherwise.

In addition, if certain parts are described as being "connected" to other parts, they are not only "directly connected" to the other parts, but also "indirectly connected" to the other parts with any other device intervened therebetween. In addition, when an element is referred to as "comprising" or "including" a component, it does not preclude another component but may further include the other component unless the context clearly indicates otherwise. Through the whole document of the present disclosure, the term "step of" does not mean "step for".

Although terminologies used in the present specification are selected from general terminologies used currently and widely in consideration of functions, they may be changed in accordance with intentions of technicians engaged in the corresponding fields, customs, advents of new technologies and the like. Occasionally, some terminologies may be arbitrarily selected by the applicant. In this case, the meanings of the arbitrarily selected terminologies shall be defined in the relevant part of the detailed description. Accordingly, the specific terms used herein should be understood based on the unique meanings thereof and the whole context of the present invention.

A device for diagnosing a battery and changing data of a battery management system (BMS) according to an embodiment of the present disclosure may be configured to include: a connection unit connected to a connector of a battery module; a communication unit connected to the connection unit and configured to transmit/receive data to/from the BMS for measuring a temperature, a current and a voltage of the battery module to calculate data according to an operation state; a control unit configured to control the data transmission/reception with the BMS, and a diagnosis unit configured to diagnose a battery state on the basis of data received from the BMS and calculate a result, a memory unit configured to store the calculated battery state diagnosis result, and a change data input unit configured to input data for data change in the BMS.

Hereinafter, embodiments of the present invention will be described in detail with reference to the accompanying drawings.

FIG. 1 schematically illustrates an entire system configuration of a typical battery diagnosis and data change system.

In relation to FIG. 1, a battery 10 may be configured to include one or more battery cells 11, a BMS 12, a communication connector 13, and a sensor 14.

The BMS 12 may perform sensing using each sensor 14 connected to the battery cell 11, calculate data according an operation state of the battery through the sensed result, and control the battery to maintain a stable state.

The diagnosis device 20 or a computer (server) 30 may receive battery data from the BMS of the battery module, and a user may check the received data and diagnose the battery state. In addition, if necessary, a separate proper program may be provided to each battery module such that the BMS 120 may change a determination reference range for determining the battery state using the temperature, voltage, or current, etc., of the battery. Furthermore, in order to change the use of the battery module configurable in various uses, the corresponding program has to be provided and changed for each use of the battery module.

However, such typical manners have limitations in cost and portability, since it is required to include separate communication equipment 22 for data transmission/reception between a battery and the diagnostic device 20 or the computer (server) 30, and a separate power supply device/cable for supplying driving power to the diagnostic device 20 or computer (server) 30. In addition, the corresponding program is required for each use of the battery module in order to change the use of the battery module, but it is cumbersome, takes time and incurs an expense to install the program.

Figure 2:
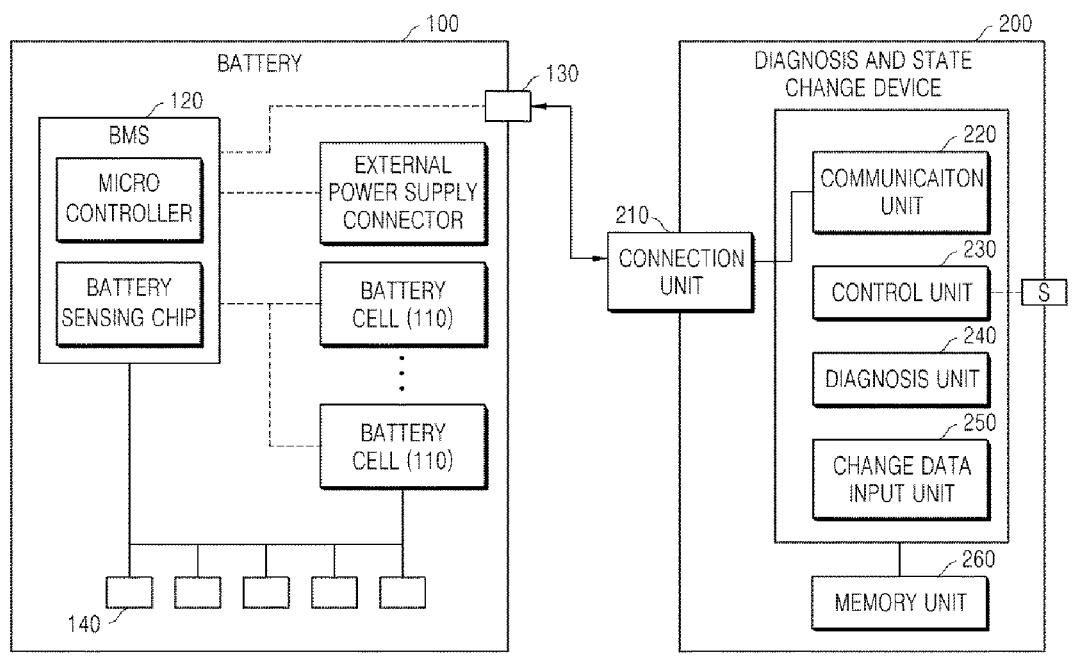
FIG. 2 schematically illustrates a battery diagnosis and data change device in accordance with an exemplary embodiment.
Figure 3:
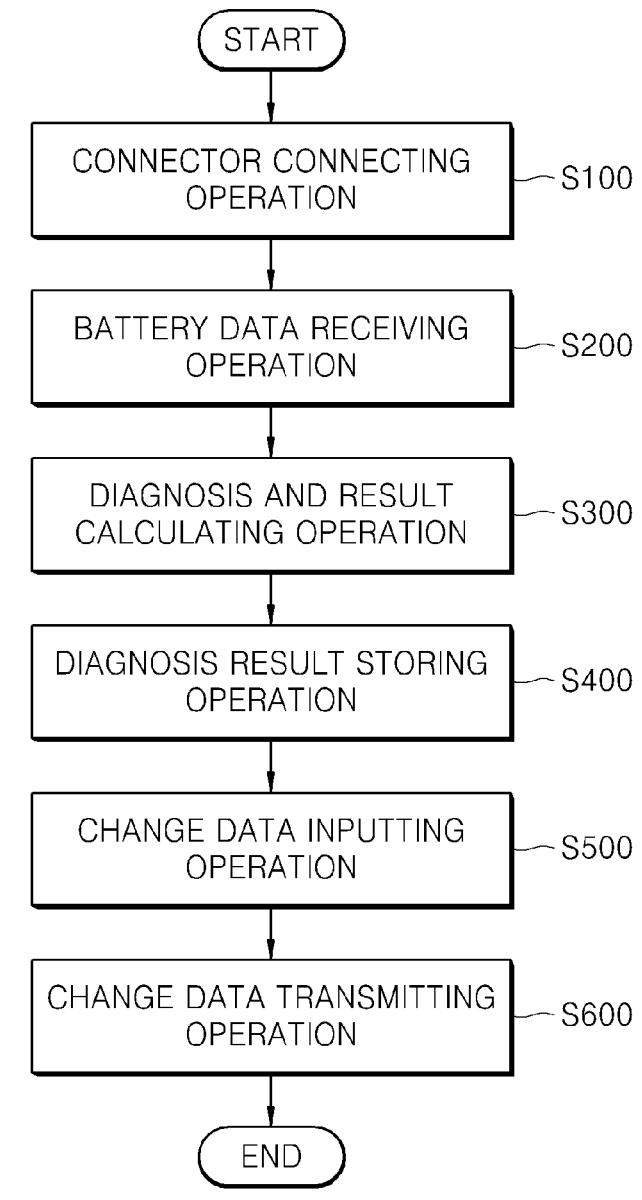
FIG. 3 is a flowchart schematically illustrating a battery diagnosis and data change method in accordance with an exemplary embodiment.

Accordingly, the present disclosure improves such limitations and provides a device and method for diagnosing a battery state in reference to FIGS. 2 and 3, and changing data in the BMS.

In relation to FIG. 2, the present disclosure may be configured from a battery 100, a BMS 120, and a diagnosis and data change device 200.

The battery 100 may be configured from at least one battery cell 110.

The BMS 120 may measure a temperature, a current, and a voltage of the battery 100 using each sensor 140 connected to the battery cell 110, and may calculate battery data on the basis of the measured temperature, current, and voltage of the battery 100. The BMS 120 may also compare the calculated data of the temperature, current and voltage with respective preset ranges to determine the battery state such as an overcurrent or overdischarge, and to control the battery to be stably maintained.

The battery data may include, for example, a cell voltage, a module voltage, a temperature, a state of charge (SOC), a state of health (SOH), or a current value, etc.

The connection unit 210 may have a configuration connected to the connector of the battery module. The connection unit 210 is configured in a type like a terminal to be connected to the connector of the battery module, and the battery diagnosis and data change device 200 may be driven by receiving power from the battery module through the connection with the connector.

The communication unit 220 may transmit/receive data to/from the BMS 120. The communication unit 220 is connected to the connection unit 210, and when the connection unit 210 and the connector 130 of the battery module is connected, communication may be connected for the data transmission/reception with the BMS 120.

The control unit 230 may control a start of the data transmission/reception with the BMS 120 and the communication unit 220. After connection between the connector 130 of the battery module and the connection unit 210, in order to start the data transmission/reception with the BMS 120, for example, the user may press a switch connected to the control unit 230. When the user presses the switch, the control unit 230 outputs a data transmission/reception start signal to the communication unit 220 according to the switch input, and the communication unit 220 performs the data transmission/reception with the BMS 120.

A diagnosis unit 240 diagnoses and analyzes the battery data received from the BMS 120 through the communication unit 220 to calculate a result for the battery state.

The diagnosis unit 240 may diagnose and analyze the battery data using, for example, a software configuration provided therein, and calculate the result for the battery state on the basis of the diagnosis and analysis result. To diagnose and analyze the battery data may be, for example, to diagnose and analyze a physical defect state inside the battery module, or the SOH, and calculate the result therefor.

Here, the battery data may include, for example, a module voltage, a temperature, an SOC, an SOH, or a current value, etc.

A change data input unit 250 may have a configuration of inputting data desired to be changed, when it is necessary to change data preset in the BMS 120.

In detail, the change data input unit 250 may be configured as the following embodiment.

Embodiment 1

Embodiment 1 of the change data input unit 250 may change determination data for determining the battery state using the battery data in the BMS 120.

For example, according to a user request or when testing the battery module, the change data input unit 250 receives the determination data for determining the battery state from the BMS 120, changes the received determination data to determination data for determining a desired battery state, and then inputs the changed determination data.

After the changed determination data for determining the battery state is input, the BMS 120 may store the changed data received from the diagnosis and state change device 200 and determine the battery state according to the changed data.

Here, the determination data for determining the battery state means each control range such as each cell voltage, module voltage, temperature, SOC, SOH, or current set in the BMS for controlling the battery module in a stable state, and when the measured and calculated battery data does not satisfy the control ranges, the BMS 120 may check the battery state such as overcurrent or overvoltage and inform an error occurrence.

Embodiment 2

Embodiment 2 of the data change input unit 250 may have a configuration of inputting change data for preset data in the BMS 120 in order to change the use of the battery module.

The battery module may be used for, for example, storing electricity generated from an uninterruptible power supply (UPS) or a grid generation system such as solar power/wind power/hydroelectric power generation, and data according to the use of the battery module may be set in the BMS.

Accordingly, in order to change the use of the battery module, data setting values are received according to the use set in the BMS 120, and then the data setting values may be changed to data setting values according to the use desired to be changed and input to the change data input unit 250. Accordingly, the input changed data may be transmitted to the BMS 120 and the BMS 120 may change the use of the battery module by controlling the battery module according to the received changed data.

Here, the data setting values according to the use may include a cell voltage, a module voltage, a temperature, an SOC, an SOH, or a current value, etc.

The memory unit 260 may store the diagnosis result calculated for the battery state calculated in the diagnose unit 240. The memory unit 260 may store a result of diagnosis and analysis for the battery state and check the battery diagnosis and analysis result obtained by executing the diagnosis and analysis for a prescribed period according to a user request.

FIG. 3 is a flowchart schematically illustrating a battery diagnosis and data change method in accordance with an exemplary embodiment.

Referring to FIG. 3, a method for diagnosing a state of the battery module and changing data set in the BMS includes a connector connection operation S100 for connection to a connector of the battery module; a data receiving operation S200 for reading data of the battery from the BMS configured to measure a temperature, a current, and a voltage of the battery module and calculate data according to an operation state of the battery module, a diagnosis and result calculating operation S300 for diagnosing a state of the battery module on the basis of the battery data received from the BMS and calculating a result, and a diagnosis result storing operation S400 for storing the calculated result; and a change data inputting operation S500 for inputting change data for changing data in the BMS; and a change data transmitting operation S600 for transmitting the input change data to the BMS.

Specifically, the connector connection operation S100 may be an operation for connection to the battery module. Through the connection to the connector provided in the battery module, power may be received from the battery module. In other words, the battery diagnosis and state change device 200 may be driven by receiving power through the connection to the connector of the battery module.

The battery data receiving operation S200 may be an operation for receiving battery data from the BMS 120, after connection to the connector of the battery module.

In order to receive the battery data from the BMS, for example, after the connection to the battery module, the user may press the switch. According to the switch input, a transmission/reception signal may be output and according the output of the transmission/reception signal, the battery data may be received from the BMS 120 through the connector connection.

Here, the battery data may be data according to battery state measured and calculated in the BMS. The BMS 120 may measure the temperature, current, and voltage of the battery 100 using each sensor 140 connected to the battery cell 110, and may calculate battery data on the basis of the measured temperature, current, and voltage of the battery 100. In addition, the BMS 120 may also compare the calculated data of the temperature, current and voltage with each preset range to determine the battery state such as an overcurrent or overdischarge, and control the battery to be stably maintained.

Accordingly, the battery data may include, for example, the cell voltage, module voltage, temperature, SOC, SOH, or the current value, etc.

The diagnosis and result calculating operation S300 may be an operation of diagnosing and analyzing the battery data received from the BMS to calculate a result of the battery module state. The diagnosis and result calculating operation S300 may diagnose and analyze the battery data using, for example, a software configuration provided in the diagnosis unit 240, and calculate the result for the battery state on the basis of the diagnosis and analysis result.

To diagnose and analyze the battery data may be, for example, to diagnose and analyze a physical defect state or SOH in the battery module to calculate the result therefor.

Here, the battery data may include, for example, the cell voltage, module voltage, temperature, SOC, SOH, or the current value, etc.

The diagnosis result storing operation S400 may be an operation for storing a diagnosis result for the battery state calculated in the diagnosis and result calculating operation S300. The result of battery state diagnosis and analysis performed for a prescribed period may be checked according to a user request by storing the result for the battery state.

The change data inputting operation S500 may be an operation for inputting change data for changing the data set in the BMS 120. The change data inputting operation S500 may be configured as the following embodiment.

Embodiment 1

Embodiment 1 of the change data inputting operation S500 may be an operation for changing determination data for determining the battery state using the battery data in the BMS 120.

For example, according to a user request or when a test for the battery module is performed, the determination data for determining the battery state is received from the BMS 120 and changed to determination data for determining a desired battery state, and then the changed determination data is input (operation S500). After the changed determination data for determining the battery state is input and then transmitted to the BMS 120, the BMS 120 may store the received changed data and determine the battery state according to the changed data.

Here, the determination data for determining the battery state means each control range such as each cell voltage, module voltage, temperature, SOC, SOH, or current set in the BMS for controlling the battery module in a stable state, and when the measured and calculated battery data does not satisfy the control ranges, the BMS 120 may check the battery state such as an overcurrent or overvoltage and inform an error occurrence.

Embodiment 2

Embodiment 2 of the data change inputting operation S500 may be configured from an operation for inputting change data for preset data in the BMS 120 in order to change the use of the battery module.

The battery module may be used for, for example, storing electricity generated in an uninterruptible power supply (UPS) or a grid generation system such as solar power/wind power/hydroelectric power generation, and data according to the use of the battery module may be set in the BMS.

Accordingly, in the change data inputting operation 500, data setting values may be received according to the use set in the BMS 120 for the use change of the battery module, and then the data setting values may be changed to data setting values according to the use desired to be changed and input. Accordingly, the input changed data is transmitted to the BMS 120 and the BMS 120 may change the use of the battery module by controlling the battery module according to the received changed data.

Here, the data setting value according to the use may include a cell voltage, a module voltage, a temperature, an SOC, an SOH, or a current value, etc.

The change data transmitting operation S600 may be an operation for transmitting the changed data input in the data change inputting operation S500 to the BMS. After the input of the changed data, for example, when a switch provided in the battery diagnosis and data change device 200 is pressed, a data transmission/reception control signal may be output. When the data transmission/reception control signal is output, the input changed data may be transmitted to the BMS. Accordingly, the BMS may store the received changed data and change the use of the battery module according to the changed data.

In this way, the state diagnosis, data change in the BMS and the use change of the battery module, etc., are simply performed without providing separate power supplying equipment or communication equipment, and therefore enhanced aspects in time and cost may be provided.

According to the present disclosure, data transmission/reception is performed through a connection to a connector of a battery module and power is received from the battery module through the connector, and thus it is not necessary to provide separate communication equipment for data communication with the battery module, which results cost reduction.

In addition, since a diagnostic reference value of the battery management system (BMS) and use of the battery module are changeable as necessary through the connection with the battery module, embodiments of the present disclosure provide a simple, time-saving, and cost-reducing effect.

The present disclosure has been described using preferred embodiments. However, it is to be understood that the scope of the present disclosure is not limited to the disclosed embodiments. In addition, it should be understood that all changes or modifications derived from the definitions and scopes of the Claims and their equivalents fall within the scope of the present disclosure.

What is claimed is:

1. A battery diagnosis and data change device, comprising:
a communication unit connected to a connection unit and configured to transmit/receive data to/from a battery management system (BMS) configured to measure a temperature, a current, and a voltage of a battery module, and determine that the battery module is in a stable state in response to at least one of the measured temperature, current and voltage of the battery module satisfying a first preset control range for operation parameters of the battery module, wherein the data received from the BMS includes the first preset control range and battery operation data calculated by the BMS based on the measured temperature, current and voltage of the battery module, wherein the communication unit is configured to determine occurrence of overvoltage or overcurrent in response to at least one of the measured temperature, current and voltage of the battery module not satisfying the first preset control range;

a control unit configured to control data transmission/reception of the data to/from the BMS;

a diagnosis unit configured to determine a state of the battery module based on the battery operation data and the first preset control range received from the BMS;

a memory unit configured to store the determined state of the battery module; and a change data input unit configured to transmit a preset data update containing a second preset control range to the BMS for changing the first preset control range in the BMS to the second preset control range.

2. The battery diagnosis and data change device of claim 1, wherein the connection unit is configured to receive power from the battery module upon being connected to a connector of the battery module.

3. The battery diagnosis and data change device of claim 1, wherein the data received from the BMS further comprises: a first preset use of the battery module, and wherein the preset data update transmitted from the change data input unit to the BMS further includes a second preset use for changing the first preset use of the battery module to the second preset use so as to change one or more of the operation parameters of the battery module.

4. The battery diagnosis and data change device of claim 3, wherein the first preset control range for operation parameters of the battery module includes a preset temperature control range, a preset current control range, and a present voltage control range, wherein the diagnosis unit is configured to determine that the battery module is in the stable state if the temperature, current and voltage of the battery module are within the preset temperature control range, the preset current control range, and the preset voltage control range, respectively.

5. A method for diagnosing a state of a battery module and changing data in a battery management module (BMS), wherein the BMS is configured to measure a temperature, a current, and a voltage of the battery module, and to calculate battery operation data based on the measured temperature, current and voltage of the battery module, the method being performed by a battery diagnosis and data change device coupled to the battery module and to the BMS, the method comprising:

reading the battery operation data of the battery module from the BMS and a first preset operation parameter control range calculated by the BMS based on the battery operation data;

determining that the battery module is in a stable state in response to at least one of the measured temperature, current and voltage of the battery operation data satisfying the first preset operation parameter control range received from the BMS;

determining occurrence of overvoltage or overcurrent in response to at least one of the measured temperature, current and voltage of the battery module not satisfying the first preset operation parameter control range;

storing the determined state of the battery module; and transmitting a preset data update containing second preset operation parameter control range to the BMS for changing the first preset operation parameter control range in the BMS to the second preset operation parameter control range.

6. The battery diagnosis and data change method of claim 5, further comprising receiving power from the battery module through a connector.

7. The battery diagnosis and data change method of claim 5, further comprising:

reading a first preset use of the battery module, wherein transmitting the preset data update comprises:

changing the first preset use of the battery module to a second preset use so as to change one or more of the operation parameters of the battery module.

8. The battery diagnosis and data change method of claim 7, wherein the preset operation parameter control range includes a preset temperature control range, a preset current control range and a preset voltage control range, wherein determining that the battery module is in a stable state is in response to the temperature, current and voltage of the battery module being within the preset temperature control range, the preset current control range, and the present voltage control range, respectively.

9. A battery diagnosis and reference data change device comprising:

a connection unit provided in the form of a terminal connected to a connector of a battery module and configured to provide a power supply path and a data path to the connected battery module;

a communication unit communicatively connected, through the connection unit connected to the connector of the battery module, to a battery management system (BMS) configured to measure a temperature, a current, and a voltage of the battery module, and calculate measurement data;

a switch provided on an outer surface of the battery diagnosis and data change device so as to start data transmission/reception with the communicatively connected BMS;

a control unit connected to the switch, and configured to output a transmission/reception signal according to an input of the switch and control the data transmission/reception with the BMS to be performed;

a diagnosis unit configured to diagnose and analyze a state of a battery so as to calculate a diagnosis result of the battery state on the basis of the measurement data received from the BMS;

a memory unit configured to store the diagnosis result of the battery state calculated in the diagnosis unit; and a change reference data input unit configured to input change reference data for changing determination reference data, which is preset in the BMS, for determining an operation state of the battery module, wherein the change reference data input unit comprises:

a determination reference data input unit configured to change a present reference range, in which the operation state of the battery module is determined in the BMS, to change reference range data according to a desired reference range and then input the change reference range data; and a use change reference data input unit configured to change a use reference data setting value, which corresponds to a present use of the battery module set in the connected BMS, to a use change reference data setting value, which corresponds to a desired use of the battery module, and then input the use change reference data setting value so as to change the use of the battery module.

10. A method for diagnosing a state of a battery module and changing reference data, which is preset in a battery management module (BMS), for determining an operation state of the battery module, the method comprising:
- a connector connecting operation for connecting a connection terminal provided on a device to a connector of the battery module for connection to the battery module;
- a path forming operation for forming a power supply path and data path to the battery module through the connection terminal connected to the connector of the battery module;
- a battery measurement data receiving operation for reading measurement data of a battery from the BMS configured to measure a temperature, current, and a voltage of the battery module, and to calculate the measurement data;
- a diagnosis and result calculating operation for diagnosing and analyzing a state of the battery module on a basis of the battery measurement data received from the BMS to calculate a diagnosis result of the state of the battery module;
- a diagnosis result storing operation for storing the calculated result;
- a change reference range data inputting operation for inputting change reference range data so as to change a reference range of determination reference data, which is preset in the BMS, for determining the operation state of the battery module;
- a change reference range data transmitting operation for transmitting the input change reference range data to the BMS through the data path to the battery module formed through the connector connection; and
- a reference range data resetting operation for resetting an existing reference range data set in the BMS to the change reference range data,
- wherein the change reference range data inputting operation comprises:
  - a determination reference data inputting operation for changing a present reference range, in which the operation state of the battery module is determined in the connected BMS, to the change reference range data according to a desired change reference range and then inputting the change reference range data; and
  - a use change reference data inputting operation for changing a use reference data setting value, which corresponds to a present use of the battery module set in the connected BMS, to a use change reference data setting value, which corresponds to a desired use of the battery module, and then inputting the use change reference data setting value so as to change the use of the battery module.

* * * * *